Figure 1:
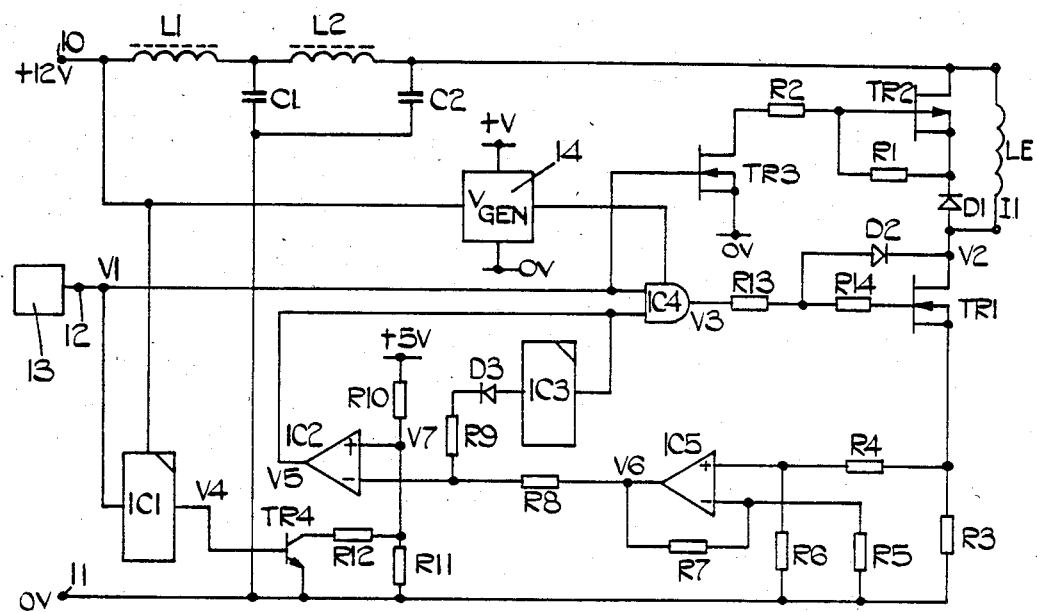

United States Patent [19]
Harvey

[11] Patent Number: 4,605,983
[45] Date of Patent: Aug. 12, 1986

[54] DRIVE CIRCUITS

[75] Inventor: Ian J. Harvey, Cricklade, England

[73] Assignee: Lucas Industries public limited company, Birmingham, England

[21] Appl. No.: 683,511

[22] Filed: Dec. 19, 1984

[30] Foreign Application Priority Data

Jan. 31, 1984 [GB] United Kingdom ............... 8402470

[51] Int. Cl.$^4$ ..................... H01H 47/32; F02D 41/30
[52] U.S. Cl. ..................................... 361/154; 123/490
[58] Field of Search ......................... 361/154; 123/490

[56] References Cited

U.S. PATENT DOCUMENTS 4,327,394 4/1982 Harper ............................... 361/154

*Primary Examiner*—Michael L. Gellner

[57] ABSTRACT

A drive circuit for an electromagnetic device including a solenoid includes a transistor in series with the solenoid and a current sensing resistor. A comparator receives a voltage signal depending on the current flow in the solenoid and by way of an "AND" gate renders the transistor conductive when a control signal appears and non conductive when the current flow exceeds a set value. A first monostable circuit modifies a reference voltage applied to the comparator and reduces the set value of the current after a predetermined time so that the solenoid is initially energised at a high current value which is then reduced to a holding value. The circuit includes a second monostable circuit which causes the transistor to be switched on and off when the current has attained the high value and when the current is at its holding value.

8 Claims, 2 Drawing Figures

DRIVE CIRCUITS

This invention relates to drive circuits for controlling the flow of current in the solenoid of an electromagnetic device in response to a control signal.

For rapid operation of the device the current in the solenoid of the device should be allowed to rise quickly to produce a high magnetic flux in the magnetic core of the device at least sufficient to cause the armature of the device to start moving. The current is allowed to rise to a peak value and after a predetermined time during which the armature completes its movement the current is reduced to a lower holding value at which the armature remains in its operated position. Current flow in the solenoid takes place as long as there is supplied to the drive circuit a control signal. In accordance with established practice it is required to pulse the current flow controlling element during the period of peak current and holding current and the object of the invention is to provide a drive circuit which satisfies the aforementioned requirements.

According to the invention a drive circuit for an electromagnetic device including a solenoid comprises first and second terminals for connection to a DC supply, one end of said solenoid being connected in use to one of said supply terminals, a first semiconductor switch having a solenoid current path connected in series in use, between the other end of said solenoid and one end of a current sensing resistor the other end of which is connected to the other supply terminal, a current recirculation loop including a diode and a second semiconductor switch connected in parallel with said solenoid, a control signal input terminal, driving means for said second semiconductor switch, said driving means being connected to said control signal input terminal whereby when the control signal is supplied to said input terminal the current recirculation loop will be rendered operative, a comparator, first means for applying a voltage signal to one input terminal of the comparator dependent upon the magnitude of the current flow in said sensing resistor, second means for generating a reference voltage which is applied to the second input terminal of the comparator, an AND gate the output of which is utilized to render the solenoid current path of the first semiconductor switch conductive, one input of the AND gate being connected to said control signal input terminal and the other input to the output of said comparator, first monostable circuit means responsive to said control signal the output of the circuit acting to modify the reference voltage supplied to the comparator after a predetermined time following receipt of the control signal, and a second monostable circuit means responsive to the output of the comparator the output of the circuit being applied to the one input of the comparator, whereby the current flow in the solenoid will rise to a peak value as determined by a first value of the reference voltage and thereafter will switch at a frequency determined by said second monostable circuit means, the current flow in the solenoid being reduced to a peak holding value after said predetermined time, the peak holding value of the current being determined by a second value of the reference voltage, the current thereafter being switched by the action of said second monostable circuit means.

Figure 2:
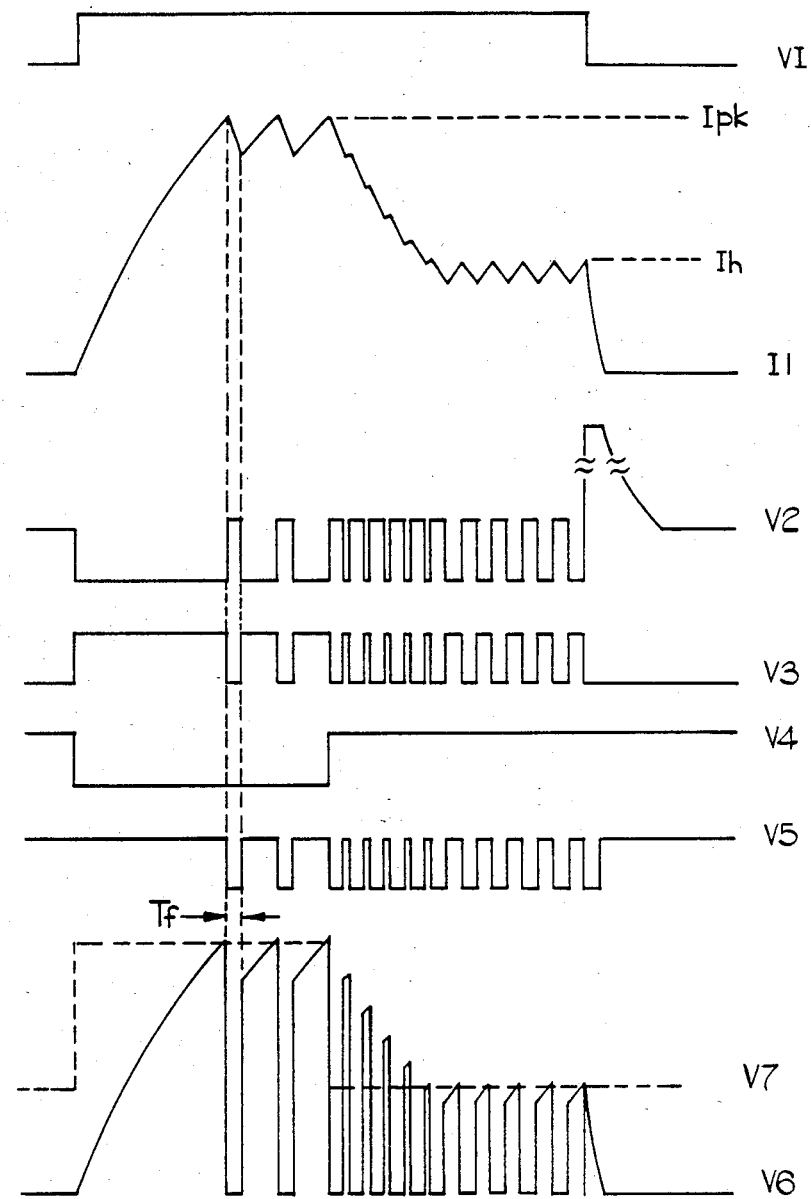

In the accompanying drawings:

FIG. 1 is a circuit diagram of one example of a drive circuit in accordance with the invention, and FIG. 2 shows the curves of voltages and current at various points in the circuit.

With reference to FIG. 1 of the drawings there is shown a drive circuit for the solenoid winding of an electromagnetic device of the kind intended to control the operation of a spill valve of a fuel pumping apparatus which supplies fuel to an internal combustion engine. The valve has to be closed to enable fuel delivery to take place to the engine and is closed by energising the device the movement taking place against the action of a spring.

The drive circuit comprises terminals 10 and 11 for connection to the positive and negative supply terminals of a DC supply in this case the terminals of the storage battery of a road vehicle driven by the engine. The solenoid L3 of the device has one end connected to terminal 10 through a pair of iron cored chokes L1, L2 connected in series. The other end of the solenoid L3 is connected to the drain of an N-channel Field Effect Transistor TR1 the source of which is connected to one end of a current sensing resistor R3 the other end of which is connected to the terminal 11. The transistor TR1 forms a first semiconductor switch.

In parallel with the solenoid L3 is the series combination of the conductive path of a P-channel Field Effect Transistor TR2 and a diode D1 the transistor TR2 and the diode D1 forming a current recirculation loop for the solenoid L3 with the transistor forming a second semiconductor switch.. The diode D1 has its anode connected to the drain of transistor TR1 as also is the cathode of a zener diode D2. The anode of the diode D2 is connected to the junction of a pair of series connected resistors R13, R14 the other end of the resistor R14 being connected to the gate of transistor TR1 and the other end of the resistor R13 being connected to the output of an AND gate IC4. The gate of transistor TR2 is connected to the junction of a pair of series connected resistors R1, R2 the other end of the resistor R1 being connected to the cathode of the diode D1 and the other end of the resistor R2 to the drain of an N-channel Field Effect Transistor TR3 the source of which is connected to terminal 11. The gate of transistor TR3 is connected to a control signal input terminal 12 and to one input terminal of the AND gate IC4. The power supply to the AND gate is provided by a separate voltage generator 14 in order that the AND gate can provide sufficient voltage to drive the transistor TR1 into a conducting state.

The voltage developed across the resistor R3 due to the passage of current therethrough is applied through a divider network comprising resistors R4 and R6 to an input of a differential amplifier IC5. The other input of which is connected to terminal 11 by way of resistor R5. A feed back resistor R7 is provided. The output of the amplifier is applied by way of a resistor R8 to one input of a comparator IC2. The output of the comparator is connected to the other input of the AND gate IC4 and to a control input of a monostable circuit IC3 the output of which is connected by way of a diode D3 and a resistor R9 in series to said one input terminal of the comparator IC2. A reference voltage is applied to the other input terminal of the comparator and this is provided by a potentiometer chain including resistors R10 and R11 connected in series. The reference voltage can be reduced by causing conduction of a transistor TR4 which has its collector emitter path connected in series with a resistor R12, across resistor R11.

The conduction of transistor TR4 is controlled by a monostable circuit IC1 which has an input connected to terminal 12. Terminal 12 is connected to a control signal generator 13 which is a complex circuit which receives timing signals etc. from the associated fuel pump so that the control signal is generated at the correct time and for a period of time appropriate to the amount of fuel to be supplied to the associated engine. At various positions on the circuit diagram voltage references are indicated these corresponding to the curves of FIG. 2.

In operation and when a positive control signal is supplied to terminal 12, transistor TR3 is turned on and this in turn enables the current recirculation loop comprising diode D1 and transistor TR2. In addition, for reasons which will become clear, a signal appears at the output of the AND gate which turns transistor TR1 on and current starts to flow in the solenoid winding L3 and the current sensing resistor R3. The rate of current rise in the solenoid winding depends upon the circuit resistance and inductance and as the current increases so also does the voltage developed across the resistor R3 and the voltage V6 at the output of the amplifier IC5. At some point on the rising current curve the armature of the solenoid will start to move but before the movement is completed the current flow in the solenoid winding will reach a peak value at which the transistor TR1 is rendered non conductive. When this occurs the decaying flux in the magnetic core of the electromagnetic device induces a reverse voltage which in turn causes current flow in the current recirculation loop. The current is allowed to decay for a short period and then transistor TR1 is switched on again. The current again rises to its peak value and the process is repeated for at least as long as is required for the armature to move to its fully operated position. The mechanism by which this is achieved will now be described.

Ignoring for the moment the monstable IC1, transistor TR4 and resistor R12, the output of comparator IC2 is normally high but as the voltage V6 at the output of the amplifier increases a point will be reached at which it equals the reference voltage set by resistors R10 and R11. At this point the output of the comparator goes low thereby causing the output of the AND gate IC4 to go low and turning off transistor TR1. The comparator IC2 is maintained in this state by the action of monostable IC3 which is triggered by the negative going edge of the output signal of the comparator and maintains by way of diode D3 and resistor R9, a clamping voltage at the input of the comparator, which is higher than the reference voltage. Transistor TR1 is therefore held off until the time period shown as Tf in FIG. 2, of the monostable IC3 has lapsed. When the clamping voltage is removed the comparator output again goes high causing transistor TR1 to be turned on and the process is repeated.

The monostable circuit IC1 acts to determine the time during which the current in the solenoid winding is cycled up to the peak value. The monostable circuit IC1 is triggered by the control signal applied to terminal 12 and its output prevents conduction of transistor TR4 so that the reference voltage is raised. At the end of its time period transistor TR4 is rendered conductive placing resistor R12 in parallel with resistor R11 and reducing the reference voltage applied to the comparator IC2. The practical effect is that the current flow in the solenoid winding falls to a holding level and at this level, the monostable IC3 again acts to turn transistor TR1 on and off in the manner described above so that the holding current rises and falls with the peak value designated $I_h$ in FIG. 2. During the period when the current in the solenoid winding is falling to the holding level transistor TR1 is switched on and off and it will be observed that very small current pulses do occur. This is because at the end of the time period of monostable IC3 the comparator output goes high and turns transistor TR1 on. The current flowing in the solenoid starts to increase and the output voltage of the amplifier IC5 rises to a value in excess of the lower reference voltage applied to the comparator, the latter therefore operates to turn transistor TR1 off. The current pulses are of short duration and the power consumption can be ignored.

The current flow in the solenoid winding L3 can be reduced to zero at any point in the cycle by removing the control signal. Removing the control signal means that the output of the AND gate IC4 goes low thereby turning transistor TR1 off. In addition, transistor TR3 is rendered non conductive so that the current recirculation loop is no longer operative. As the flux in the core of the electromagnetic device collapses a voltage is induced in the solenoid which raises the voltage on the drain of transistor TR1 to a value above the voltage on terminal 10 and eventually to a voltage sufficient to cause breakdown of zener diode D2. At this point the current which flows in diode D2 turns transistor TR1 on thereby clamping the voltage V2. The current flow in the solenoid therefore reduces very quickly to zero. As the current flow reduces so also does the voltage V2 and the current flowing in the diode D2. As the voltage falls below the breakdown voltage the current flow in diode D2 ceases and transistor TR1 is turned off.

It will be noted that the monostable circuit IC1 has a connection to the supply terminal 10. This ensures that the period of the monostable varies with the supply voltage to compensate for the increased rate of current rise in the solenoid as the supply voltage increases. In particular this adjustment of the period ensures that at low supply voltages the current flowing in the solenoid is not reduced to the holding level before the armature has reached its operated position. In relation to the monostable circuit IC3 it should be noted that its period Tf is constant and therefore the "OFF" period of the transistor TR1 is constant.

The use of field effect transistors allows very high current levels to be employed but at the same time a high voltage is required for driving purposes. This is the reason for the supply 14 to the AND gate IC4. In a modification the AND gate can be of more conventional design feeding a series of parallel connected inverters supplied from the supply 14 with a signal inverting arrangement connected between the AND gate and the parallel connected inverters.

In view of the high currents which are possible with the circuit and the high switching rates afforded by the use of field effect transistors a T type filter comprising chokes L1 and L2 and capacitor C1 is provided. Capacitor C2 is also necessary to prevent the line and filter inductances generating high voltages when transistor TR1 is turned off.

I claim:

1. A drive circuit for controlling the flow of electric current in the solenoid of an electromagnetic device in response to a control signal comprising first and second terminals for connection to a DC supply, one end of said solenoid being connected in use to one of said supply terminals, a first semiconductor switch having a solenoid current path connected in series in use, between the other end of said solenoid and one end of a current sensing resistor the other end of which is connected to the other supply terminal, a current recirculation loop including a diode and a second semiconductor switch connected in parallel with said solenoid, a control signal input terminal, driving means for said second semiconductor switch, said driving means being connected to said control signal input terminal whereby when the control signal is supplied to said input terminal the current recirculation loop will be rendered operative, a comparator, first means for applying a voltage signal to one input terminal of the comparator dependent upon the magnitude of the current flow in said sensing resistor, second means for generating a reference voltage which is applied to the second input terminal of the comparator, an AND gate the output of which is utilized to render the solenoid current path of the first semiconductor switch conductive, one input of the AND gate being connected to said control signal input terminal and the other input to the output of said comparator, first monostable circuit means responsive to said control signal the output of the circuit acting to modify the reference voltage supplied to the comparator after a predetermined time following receipt of the control signal, and a second monostable circuit means responsive to the output of the comparator the output of the circuit being applied to the one input of the comparator, whereby the current flow in the solenoid will rise to a peak value as determined by a first value of the reference voltage and thereafter will switch at a frequency determined by said second monostable circuit means, the current flow in the solenoid being reduced to a peak holding value after said predetermined time, the peak holding value of the current being determined by a second value of the reference voltage, the current thereafter being switched by the action of said second monostable circuit means.

2. A drive circuit according to claim 1 in which the period of the second monostable circuit is constant.

3. A drive circuit according to claim 1 or claim 2 in which said first monostable circuit is responsive to the level of the D.C. supply whereby the period of the first monostable circuit varies with the level of the D.C. supply.

4. A drive circuit according to claim 3 in which the period increases as the level of the D.C. supply decreases.

5. A drive circuit according to claim 1 including voltage sensitive means responsive to the voltage at the other end of said solenoid and operative to render said first semiconductor switch conductive when said current recirculation loop is inoperative.

6. A drive circuit according to claim 5 in which said voltage sensitive means comprises a zener diode.

7. A drive circuit according to any one of the preceding claims in which said first and second semiconductor switches are field effect transistors.

8. A drive circuit according to claim 7 including a "T" type filter through which the current flowing in said solenoid current path flows.

* * * * *